United States Patent
Takada

(10) Patent No.: US 9,887,693 B2
(45) Date of Patent: Feb. 6, 2018

(54) CLOCK SELECTION CIRCUIT AND POWER SUPPLY DEVICE EQUIPPED WITH THE SAME

(71) Applicant: SII Semiconductor Corporation, Chiba-shi, Chiba (JP)

(72) Inventor: Kosuke Takada, Chiba (JP)

(73) Assignee: SII SEMICONDUCTOR CORPORATION, Chiba (JP)

(*) Notice: Subject to any disclaimer, the term of this patent is extended or adjusted under 35 U.S.C. 154(b) by 0 days.

(21) Appl. No.: 15/385,186

(22) Filed: Dec. 20, 2016

(65) Prior Publication Data

US 2017/0187362 A1    Jun. 29, 2017

(30) Foreign Application Priority Data

Dec. 28, 2015 (JP) ................................ 2015-257252

(51) Int. Cl.
| | | |
|---|---|---|
| G06F 1/04 | (2006.01) | |
| H03K 5/135 | (2006.01) | |
| G06F 1/32 | (2006.01) | |

(52) U.S. Cl.
CPC .............. *H03K 5/135* (2013.01); *G06F 1/04* (2013.01); *G06F 1/324* (2013.01); *G06F 1/3287* (2013.01); *Y02B 60/1217* (2013.01)

(58) Field of Classification Search
CPC ........ H03K 5/135; H03K 3/355; H03K 3/033; G06F 1/04; G06F 1/3287; G06F 1/324; G06F 11/1604; G06F 11/20; Y02B 60/1217

See application file for complete search history.

(56) References Cited

U.S. PATENT DOCUMENTS 8,212,601 B2 * 7/2012 Davis .................. G06F 11/1604
327/20

FOREIGN PATENT DOCUMENTS

JP       05-165543 A       7/1993

* cited by examiner

*Primary Examiner* — Jung Kim
(74) *Attorney, Agent, or Firm* — Brinks Gilson & Lione

(57) ABSTRACT

To provide a clock selection circuit capable of reducing clock omission generated when switching from a state of being synchronized with a first clock to a second clock. The clock selection circuit is equipped with a clock detection circuit which detects a first clock to output a detected signal, a switch which outputs the first clock when the detected signal is at a first level and outputs a second clock when the detected signal is at a second level different from the first level, and a one-shot circuit which outputs a one-shot pulse in response to switching of the detected signal from the first level to the second level. The output of the switch and the output of the one-shot circuit are added to be outputted as an output clock.

8 Claims, 5 Drawing Sheets

US 9,887,693 B2

CLOCK SELECTION CIRCUIT AND POWER SUPPLY DEVICE EQUIPPED WITH THE SAME

RELATED APPLICATIONS

This application claims priority under 35 U.S.C. § 119 to Japanese Patent Application No. 2015-257252 filed on Dec. 28, 2015, the entire content of which is hereby incorporated by reference.

BACKGROUND OF THE INVENTION

Field of the Invention

The present invention relates to a clock selection circuit and a power supply device equipped with the same.

Background Art

A circuit diagram of a clock selection circuit 400 illustrated in Patent Document 1 is illustrated in FIG. 4 as one example of a related art clock selection circuit.

The clock selection circuit 400 is equipped with a clock switching circuit 1, a main clock monitoring circuit 2, and a shift register 3.

The clock switching circuit 1 is inputted with a first clock f1 and a second clock f2 and outputs either one of the first clock f1 and the second clock f2 as an output clock φ of the clock selection circuit 400, based on an output 4 of the shift register 3.

The shift register 3 includes two D flip-flop circuits 41 and 42. An output Q1 of the D flip-flop circuit 41 is inputted to an input terminal D of the D flip-flop circuit 42. An output Q2 of the D flip-flop circuit 42 is outputted as the output 4 of the shift register 3 and inputted to the clock switching circuit 1.

The main clock monitoring circuit 2 supplies a reset signal R1 generated based on the first clock f1 to respective reset terminals R of the D flip-flop circuits 41 and 42.

The second clock 12 is supplied to respective clock terminals C of the D flip-flop circuits 41 and 42.

Such a related art clock selection circuit 400 outputs the first clock f1 as the output clock φ of the clock selection circuit 400 when the first clock f1 is inputted thereto, and outputs the second clock f2 as the output clock φ when the first clock f1 is stopped.

Thus, according to the related art clock selection circuit 400, the first clock f1 and the second clock 12 can be selectively outputted.

[Patent Document 1] Japanese Patent Application Laid-Open No. Hei 5(1993)-165543

SUMMARY OF THE INVENTION

The clock selection circuit 400, however, causes clock omission that clocks equivalent to two times of the second clock f2 will be lost during a period from the stop of the input of the first clock f1 at a time t0 to the output of the second clock f2 as the output clock φ as illustrated in a timing chart of FIG. 5.

That is, when the input of the first clock f1 is stopped at the time t0, the D flip-flop circuit 41 takes in a HIGH level inputted to an input terminal D thereof in response to the trailing edge of the first-time second clock f2 subsequent to its stop and outputs a signal Q1 of a HIGH level from an output terminal Q thereof. Subsequently, the D flip-flop circuit 42 takes in the signal (Q1) of the HIGH level inputted to the input terminal D thereof in response to the trailing edge of the second-time second clock f2 and outputs a signal Q2 of a HIGH level from an output terminal Q thereof as the output 4 of the shift register 3.

Since the output 4 of the shift register 3 is brought to the HIGH level, the clock switching circuit 1 is switched to a state of outputting the second clock f2 as the output clock φ. Thus, the subsequent third-time second clock f2 is outputted as the output clock φ of the clock selection circuit 400.

With the operations as described above, the related art clock selection circuit 400 is accompanied by a problem that the clock omission occurs that the clocks equivalent to the two times of the second clock f2 will be lost during the period from the stop of the input of the first clock f1 to the output of the second clock f2 as the output clock φ. Such clock omission may lead to a reduction in output voltage when the application of supplying the output clock φ is, for example, a switching regulator.

The present invention has been invented to solve the foregoing problem and aims to provide a clock selection circuit capable of reducing clock omission generated when switching from a state of being synchronized with a first clock (e.g., external clock) to a second clock (e.g., internal clock).

The clock selection circuit of the present invention is equipped with a clock detection circuit which detects a first clock to output a detected signal, a switch which outputs the first clock when the detected signal is at a first level and outputs a second clock when the detected signal is at a second level different from the first level, and a one-shot circuit which outputs a one-shot pulse in response to switching of the detected signal from the first level to the second level. The clock selection circuit adds the output of the switch and the output of the one-shot circuit to be outputted as an output clock.

According to the clock selection circuit of the present invention, an effect is brought about that since the clock selection circuit generates a one-shot pulse in response to switching of a detected signal and adds it to an output of a switch followed by its output, it is capable of reducing clock omission generated when switching from a state of being synchronized with a first clock (e.g., external clock) to a second clock (e.g., internal clock).

DETAILED DESCRIPTION OF THE PREFERRED EMBODIMENTS

Figure 1:
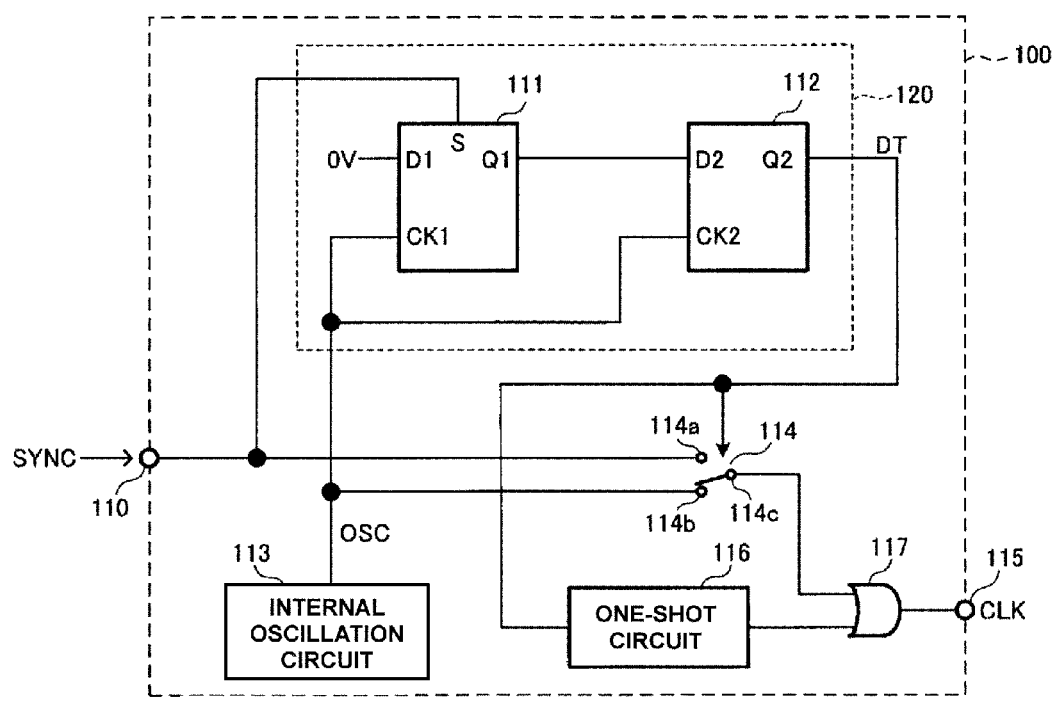
FIG. 1 is a circuit diagram for describing a clock selection circuit of the present embodiment.

FIG. 1 is a circuit diagram of a clock selection circuit 100 according to the present embodiment.

The clock selection circuit 100 is equipped with an input terminal 110 inputted with an external clock SYNC (hereinafter also called a "first clock"), a clock detection circuit 120, an internal oscillation circuit 113 which outputs an internal clock OSC (hereinafter also called a "second clock"), a switch 114, an output terminal 115 which outputs an output clock CLK of the clock selection circuit 100, a one-shot circuit 116, and an OR circuit 117.

The clock detection circuit 120 is comprised of D flip-flop circuits 111 and 112.

The D flip-flop circuit 111 receives 0V at its input terminal D1 and receives the internal clock OSC at its input terminal CK1, and has an output terminal Q1 connected to an input terminal D2 of the D flip-flop circuit 112.

The D flip-flop circuit 112 receives the internal clock OSC at its input terminal CK2 and outputs a signal of an output terminal Q2 thereof as a detected signal DT of the clock detection circuit 120.

The detected signal DT is inputted to the one-shot circuit 116 and functions as a control signal of the switch 114.

The OR circuit 117 receives an output signal of the one-shot circuit 116 and an output signal of the switch 114 therein as its inputs and outputs the output clock CLK to the output terminal 115.

The switch 114 receives the external clock SYNC at its first input terminal 114a, receives the internal clock OSC at its second input terminal 114b, and inputs the signal of its output terminal 114c to the OR circuit 117. Then, when the detected signal DT being the control signal is at a HIGH level, the switch 114 connects the first input terminal 114a and the output terminal 114c to each other. When the detected signal DT being the control signal is at a LOW level, the switch 114 connects the second input terminal 114b and the output terminal 114c to each other.

The one-shot circuit 116 is configured to output a one-shot pulse only when a trailing edge occurs in the input signal, i.e., the signal as the detected signal DT, and output a signal of a LOW level when other than it.

The operation of the clock selection circuit according to the present embodiment will next be described with reference to FIGS. 1 and 2.

A description will first be made about an external synchronous state in which the external clock SYNC is being inputted.

Since 0V is inputted to the input terminal D1, the internal clock OSC is inputted to the input terminal CK1, and the external clock SYNC is inputted to a set terminal S, the D flip-flop circuit 111 outputs a signal of a HIGH level from the output terminal Q1.

Since the signal of HIGH level from the output terminal Q1 is inputted to the input terminal D2, and the internal clock OSC is inputted to the input terminal CK2, the D flip-flop circuit 112 outputs a signal of a HIGH level from the output terminal Q2. That is, the clock detection circuit 120 outputs the signal of HIGH level as the detected signal DT in a state in which the external clock SYNC is being inputted.

Since the detected signal DT is at the HIGH level, the switch 114 connects the first input terminal 114a and the output terminal 114c to each other to output the external clock SYNC. Further, the one-shot circuit 116 outputs a signal of a LOW level in the external synchronous state in which the detected signal DT is at the HIGH level.

Since the OR circuit 117 receives the signal of LOW level being the output signal of the one-shot circuit 116 and the external clock SYNC being the output signal of the switch 114 therein as its inputs, the output clock CLK becomes equivalent to the external clock SYNC.

A description will next be made about an external synchronous release state in which the external clock SYNC is being stopped.

When the input of the external clock SYNC is stopped at a time t1 and subsequently the trailing edge of the first-time internal clock OSC occurs, the D flip-flop circuit 111 outputs a signal of a LOW level from the output terminal Q1 because the input terminal D1 is connected to 0V and the LOW level is inputted to the set terminal S.

Following the above, when the trailing edge of the second-time internal clock OSC occurs, the D flip-flop circuit 112 outputs a signal of a LOW level from the output terminal Q2 as the detected signal DT because the signal of the LOW level is inputted to the input terminal D2.

When the detected signal DT being the control signal is brought to the LOW level, the switch 114 connects the second input terminal 114b and the output terminal 114c to each other to output the internal clock OSC to the OR circuit 117.

Further, the one-shot circuit 116 outputs a one-shot pulse in response to the trailing edge of the detected signal DT.

Figure 2:
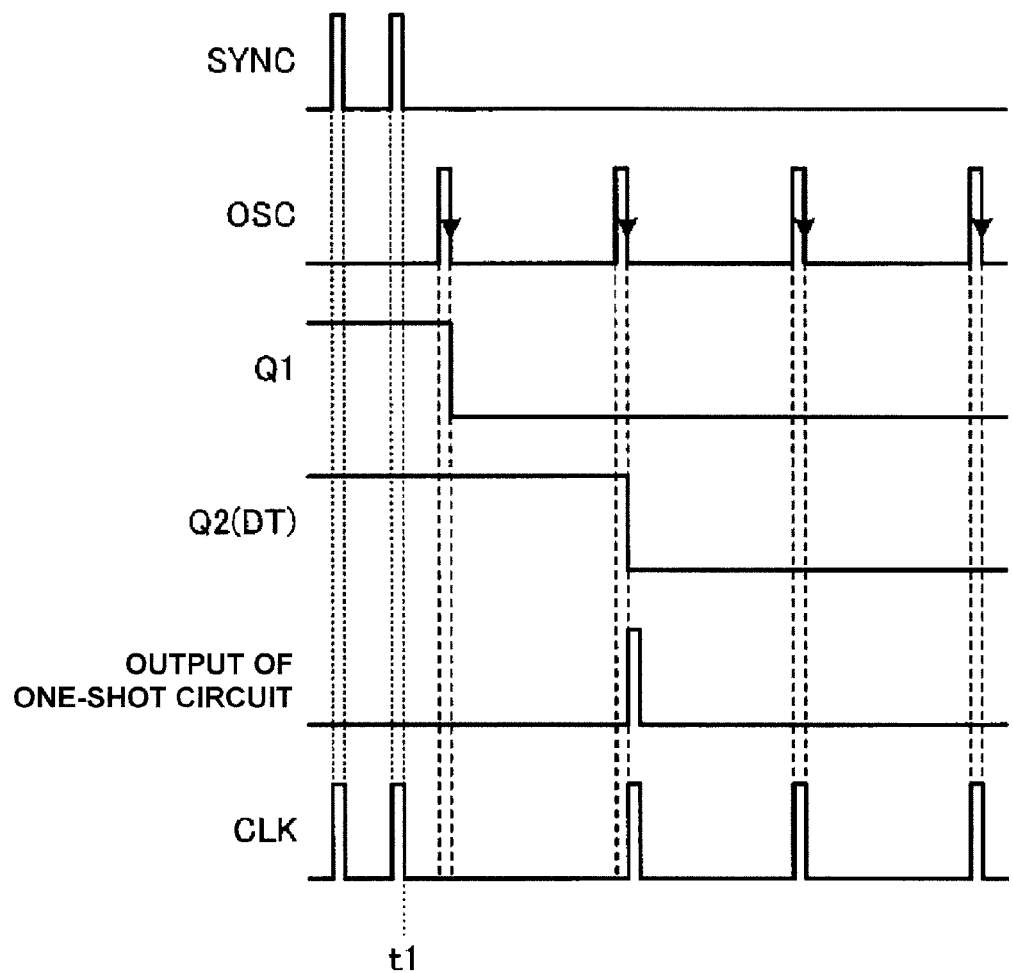
FIG. 2 is a timing chart illustrating the operation of the clock selection circuit of FIG. 1.

Since the OR circuit 117 adds and outputs the output of the one-shot circuit 116 and the output of the switch 114, i.e., the internal clock OSC, the output clock CLK becomes a signal including a clock corresponding to the second-time internal clock OSC after the external clock SYNC is stopped, as illustrated in FIG. 2.

Thus, according to the present embodiment, clock omission can be reduced as compared with the related art.

A description will next be made about an example in which the clock selection circuit according to the present embodiment is used in a power supply device.

Figure 3:
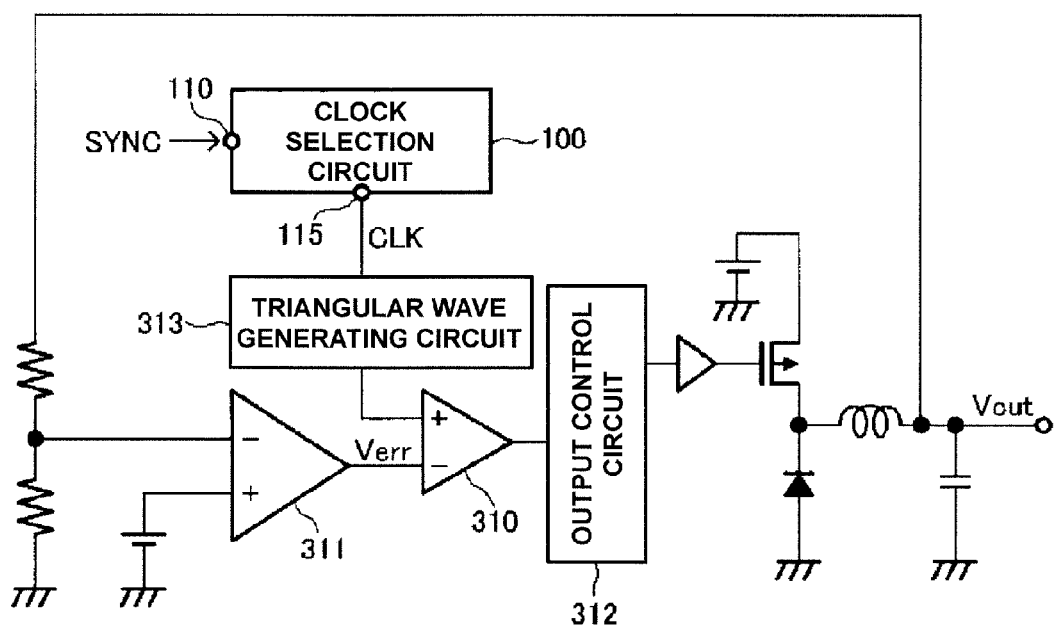
FIG. 3 is a circuit diagram of a switching regulator equipped with the clock selection circuit of FIG. 1.
Figure 4:
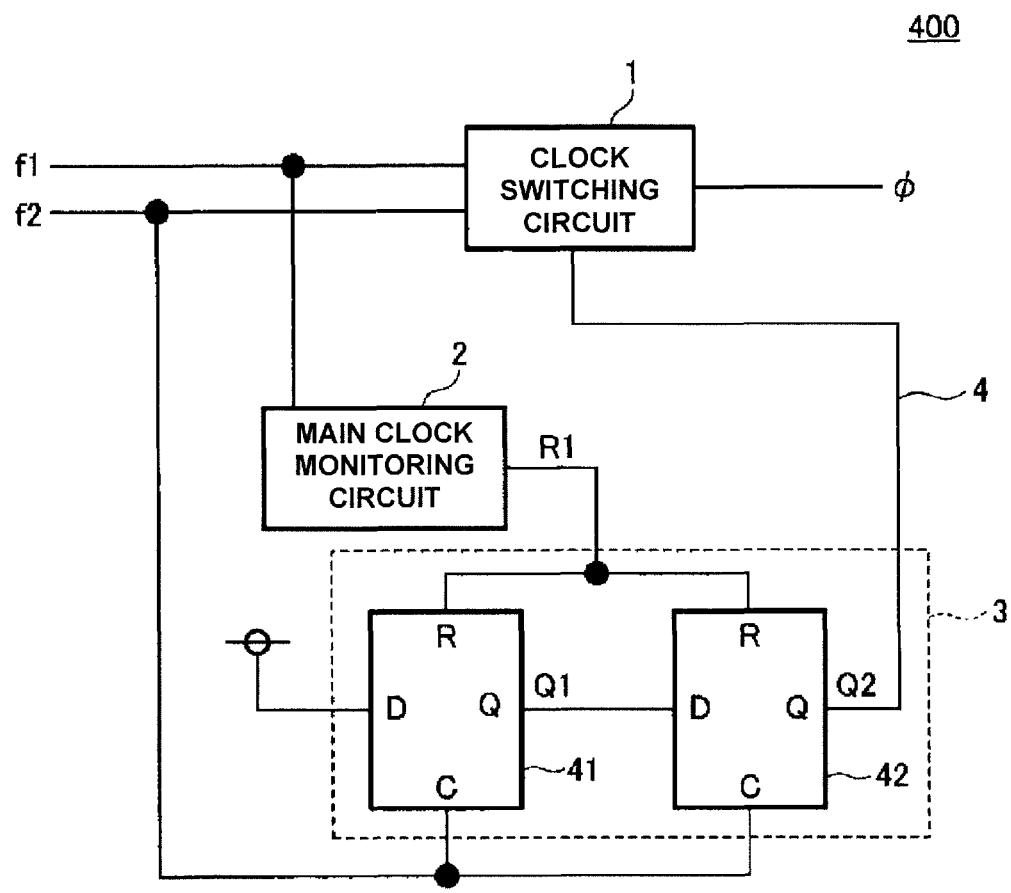
FIG. 4 is a circuit diagram of a related art clock selection circuit.
Figure 5:
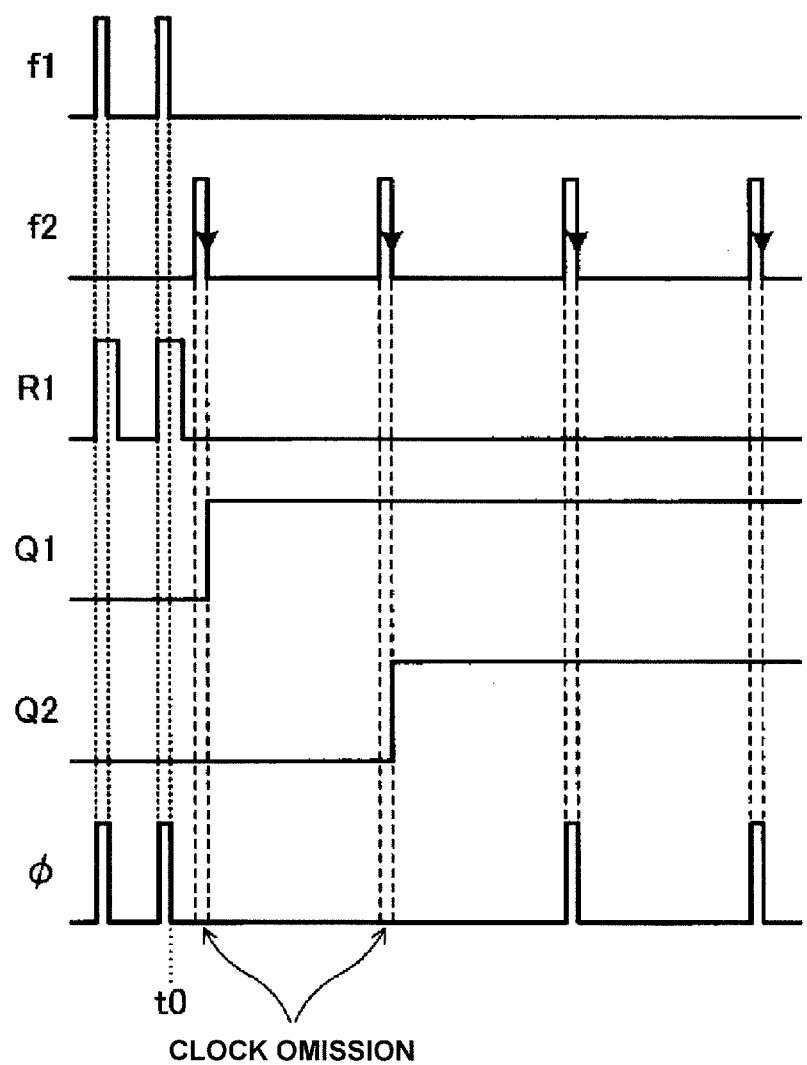
FIG. 5 is a timing chart illustrating the operation of the related art clock selection circuit.

FIG. 3 is a circuit diagram where the clock selection circuit 100 of FIG. 1 is used in a switching regulator 300 as one example of the power supply device.

Since the switching regulator 300 is general in configuration, its detailed description will be omitted herein. A description will be made about how the output clock CLK of the clock selection circuit 100 is used.

A triangular wave generating circuit 313 receives the clock CLK supplied from the clock selection circuit 100, i.e., a clock CLK corresponding to an external clock SYNC or an internal clock OSC to generate a triangular wave. A PWM comparator 310 compares an error voltage Verr outputted from an error amplifier circuit 311 and the triangular wave and supplies a comparison result to an output control circuit 312.

In the present switching regulator 300, by the use of the clock selection circuit 100, clock omission generated when switching from a state of being synchronized with the external clock SYNC to the internal clock OSC (refer to FIG. 1) is small at the clock CLK received by the PWM comparator 310. It is thus possible to decrease a reduction in the output voltage Vout of the switching regulator 300 due to the clock omission.

An effect is brought about that the influence caused by the clock omission can be reduced by using the clock selection circuit of the present invention in the power supply device using the two clocks (e.g., external clock and internal clock) as one clock by switching therebetween in this manner.

Although the embodiment of the present invention has been described above, the present invention is not limited to the embodiment referred to above. It is needless to say that various changes can be made thereto within the scope not departing from the gist of the present invention.

For example, although in the present embodiment, the OR circuit 117 is used as the circuit in which the output of the switch 114 and the output of the one-shot circuit 116 are added to be outputted as the output clock, it may be changed as appropriate according to the direction of a pulse and the like.

Also, although the above embodiment has illustrated the example in which the two D flip-flop circuits are used, the number of the D flip-flop circuits is not limited in particular. More D flip-flop circuits may be used as needed.

Further, although the switching regulator has been described as one example of the power supply device, the power supply device is not limited to the switching regulator in particular.

What is claimed is:

1. A clock selection circuit comprising:
    a clock detection circuit which detects a first clock to output a detected signal;
    a switch which outputs the first clock when the detected signal is at a first level and outputs a second clock when the detected signal is at a second level different from the first level; and
    a one-shot circuit which outputs a one-shot pulse in response to switching of the detected signal from the first level to the second level,
    wherein the output of the switch and the output of the one-shot circuit are added to be outputted as an output clock.

2. The clock selection circuit according to claim 1, wherein the clock detection circuit has a first D flip-flop circuit having a set terminal to which the first clock is inputted, and a second D flip-flop circuit having an input terminal to which an output of the first D flip-flop circuit is inputted,
    wherein the second clock is inputted to respective clock terminals of the first and second D flip-flop circuits, and
    wherein an output of the second D flip-flop circuit is the detected signal.

3. The clock selection circuit according to claim 1, further including an internal oscillation circuit which generates an internal clock,
    wherein the first clock is a clock supplied from the outside of the clock selection circuit, and
    wherein the second clock is the internal clock.

4. The clock selection circuit according to claim 2, further including an internal oscillation circuit which generates an internal clock,
    wherein the first clock is a clock supplied from the outside of the clock selection circuit, and
    wherein the second clock is the internal clock.

5. A power supply device comprising:
    a clock selection circuit according to claim 1.

6. A power supply device comprising:
    a clock selection circuit according to claim 2.

7. A power supply device comprising:
    a clock selection circuit according to claim 3.

8. A power supply device comprising:
    a clock selection circuit according to claim 4.

* * * * *